United States Patent
Horwitz et al.

(10) Patent No.: US 10,498,244 B2
(45) Date of Patent: *Dec. 3, 2019

(54) HIGH SIDE SIGNAL INTERFACE IN A POWER CONVERTER

(71) Applicant: Power Integrations, Inc., San Jose, CA (US)

(72) Inventors: Hartley Fred Horwitz, Ottawa (CA); Steven Greig Porter, Nepean (CA)

(73) Assignee: Power Integrations, Inc., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/205,038

(22) Filed: Nov. 29, 2018

(65) Prior Publication Data

US 2019/0149050 A1 May 16, 2019

Related U.S. Application Data

(63) Continuation of application No. 15/994,854, filed on May 31, 2018, now Pat. No. 10,193,453, which is a
(Continued)

(51) Int. Cl.
*H02M 3/335* (2006.01)
*H02M 1/38* (2007.01)
(Continued)

(52) U.S. Cl.
CPC ......... *H02M 3/33507* (2013.01); *H02M 1/38* (2013.01); *H02M 3/3376* (2013.01);
(Continued)

(58) Field of Classification Search
CPC ............ H02M 3/22; H02M 3/24; H02M 3/28; H02M 3/325; H02M 3/335;
(Continued)

(56) References Cited

U.S. PATENT DOCUMENTS 5,274,274 A 12/1993 Leman et al.
5,821,740 A * 10/1998 Hodgins ................. G05F 1/573
323/277

(Continued)

OTHER PUBLICATIONS

International Patent Application No. PCT/US2018/026104—International Search Report and Written Opinion dated Jun. 29, 2018, 15 pages.
(Continued)

*Primary Examiner* — Nguyen Tran
(74) *Attorney, Agent, or Firm* — Christensen O'Connor Johnson Kindness PLLC

(57) ABSTRACT

A controller for use in a power converter of a motor drive includes a control circuit configured to turn ON a high side switch by sinking a current of an ON signal. A high side signal interface circuit is coupled to receive the ON signal to generate a drive signal to control switching of the high side switch in a presence of a common mode signal caused by slewing at a half bridge node. The high side signal interface circuit includes a common mode cancellation circuit coupled to provide a common rejection signal to provide a cancellation or rejection of the common mode signal. A first current hysteresis comparator is coupled to receive a common mode rejection signal, a first current signal, and a fourth current signal, and generate a first output signal in a presence of a common mode voltage.

15 Claims, 5 Drawing Sheets

Related U.S. Application Data continuation of application No. 15/486,191, filed on Apr. 12, 2017, now Pat. No. 10,008,942.

(51) Int. Cl.
*H02M 3/337* (2006.01)
*H03K 3/013* (2006.01)
*H02M 7/48* (2007.01)
*H02M 1/00* (2006.01)

(52) U.S. Cl.
CPC ........ *H02M 3/33561* (2013.01); *H03K 3/013* (2013.01); *H02M 2001/0038* (2013.01); *H02M 2001/0058* (2013.01); *H02M 2007/4815* (2013.01); *Y02B 70/1433* (2013.01); *Y02B 70/1491* (2013.01)

(58) Field of Classification Search
CPC ..... H02M 3/33569; H02M 2007/4815; H02M 2007/4818; H02M 1/083; H02M 3/33507
USPC .................. 363/15–17, 21.01–21.03, 89, 90
See application file for complete search history.

(56) References Cited

U.S. PATENT DOCUMENTS

| | | | |
|---|---|---|---|
| 7,952,893 B2* | 5/2011 | Hiasa | H02M 3/33507 363/21.01 |
| 2002/0136034 A1* | 9/2002 | Feldtkeller | H02M 3/1563 363/21.01 |
| 2003/0184392 A1 | 2/2003 | Matsushita | |
| 2006/0158236 A1 | 7/2006 | Kozawa | |
| 2009/0251929 A1 | 10/2009 | Choi | |
| 2009/0284991 A1 | 11/2009 | Nishikawa | |
| 2012/0327692 A1 | 12/2012 | Cantoro | |
| 2014/0078787 A1 | 3/2014 | Sonobe | |
| 2014/0125380 A1 | 5/2014 | Bhuiyan | |
| 2014/0159774 A1 | 6/2014 | Bhuiyan | |
| 2014/0376272 A1 | 12/2014 | Miao | |
| 2018/0123495 A1 | 5/2018 | Baurle et al. | |

OTHER PUBLICATIONS

PLS-XS Series—Half Bridge LLC Resonat Control IC for Lighting, Dec. 2010, Fairchild Semiconductor Corporation, 14 pages.

* cited by examiner

HIGH SIDE SIGNAL INTERFACE IN A POWER CONVERTER

CROSS-REFERENCE TO RELATED APPLICATIONS

This application is a continuation of U.S. patent application Ser. No. 15/994,854, filed on May 31, 2018, now pending, which is a continuation of U.S. patent application Ser. No. 15/486,191, filed on Apr. 12, 2017, now U.S. Pat. No. 10,008,942. U.S. patent application Ser. No. 15/994,854 and U.S. Pat. No. 10,008,942 are hereby incorporated by reference.

BACKGROUND INFORMATION

Field of the Disclosure

The present invention relates generally to power converters, and more specifically to the low side to high side communication for power converters with multiple power switches.

Background

Switch mode power supplies are used in a wide variety of household or industrial appliances that require a regulated direct current (dc) voltage for their operation. A controller for switch mode power supplies for controlling the power switch for the transfer of energy can use PWM (pulse width modulation) or PFM (pulse frequency modulation) to regulate the output voltage.

One type of power supply topology is a resonant switched mode power supply. Resonant switched mode power supplies with PFM control have some advantages, which include having sinusoidal waveforms and intrinsic soft switching compared to non-resonant converters. Resonant switched mode power supplies can also operate at higher switching frequencies with low switching loss, utilize smaller magnetic elements, which therefore require smaller packaging, and still operate with high efficiency. Since resonant switched mode power supplies generally do not have waveforms with sharp edges (e.g., waveforms having high di/dt or dv/dt) EMI performance is improved, which therefore enables the use of smaller EMI filters. The output of a resonant switched mode power supply is often achieved by sensing the output and controlling power supply in a closed loop by varying the switching frequency.

LLC converters are a type of resonant switched mode power supply, which utilizes the resonance between two inductors and a capacitor. LLC converters are popular due to the savings on cost and size which can be realized by utilizing the magnetizing and leakage inductance of the transformer as at least a part of the resonance component of the LLC converter. In addition, LLC converters can achieve stability when they are operated at above resonance with zero voltage switching, which results in less switching loss and increased efficiency. Furthermore, LLC converters can achieve output regulation in a narrow band of frequency control because of their negative and high slope gain characteristic when operating above resonance.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
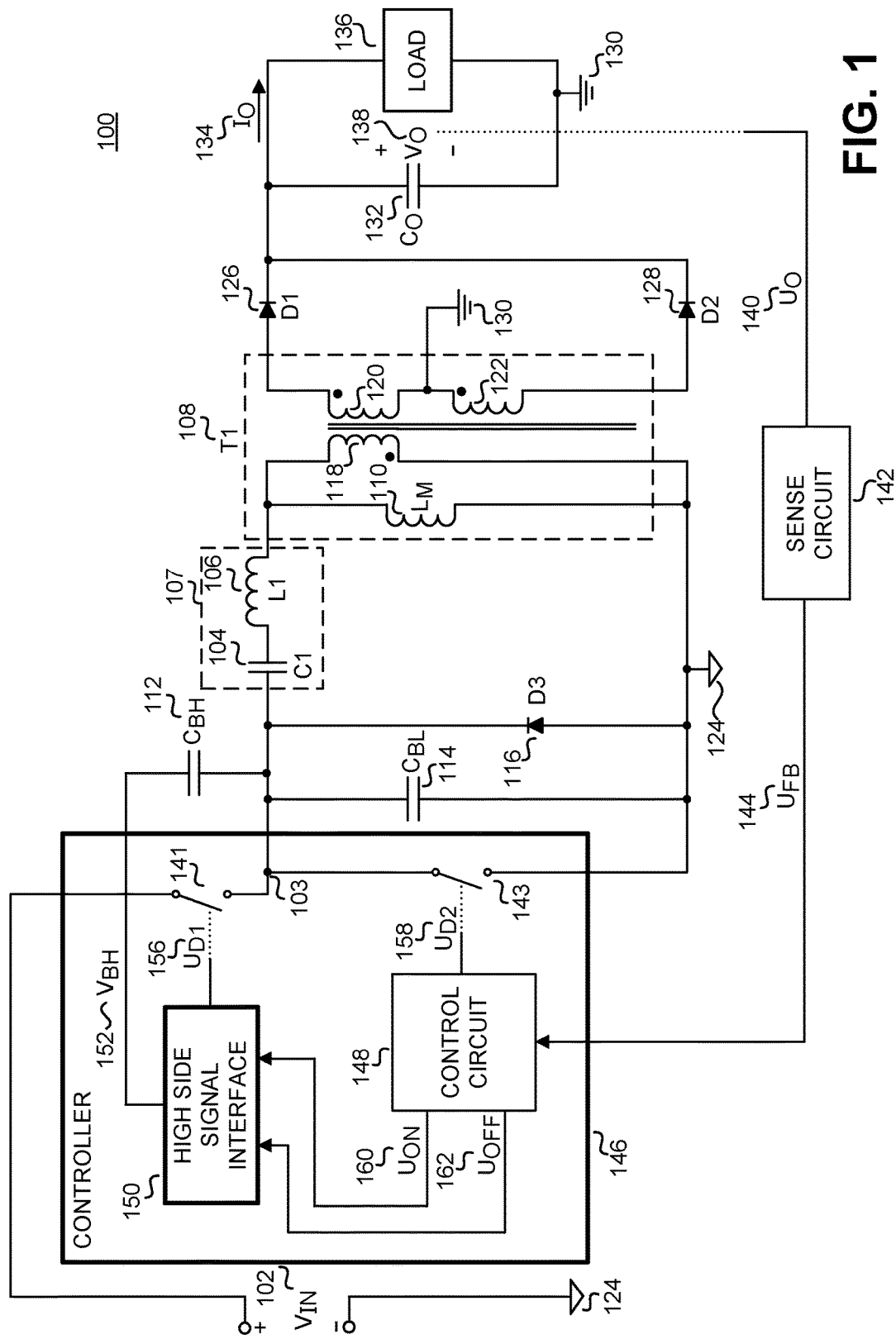
FIG. 1 is a block diagram illustrating one example of a half bridge LLC power converter that includes a controller, in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples related to a high side signal interface that reliably interprets an ON and OFF signal from a control circuit in a power converter wherein the ground reference can vary. In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Resonant converters, such as LLC converters, typically include a resonant tank circuit that include a tank inductance and a tank capacitance, as found for instance in LLC circuits. A half bridge switching circuit including a high side switch and a low side switch is coupled to the resonant tank circuit, and a half bridge driver circuit is coupled to the high side the low side switches to control the switching. A half bridge node between the high side switch and the low side switch provides a reference point for a high side driver in order to control the high side switch in the LLC converter, while the low side driver is ground referenced in order to control the low side switch. One of the challenges presented with this topology is that the voltage at the half bridge node can resonate between a ground reference and input voltage. In other words, in some examples the voltage at the half bridge node can swing between ground and 400 volts during operation. Consequently, a large common mode signal is generated due to the rising or falling of the voltage at the half bridge node, which is otherwise known as a slew event. The slew event creates differential signaling that the high side driver may misinterpret when to turn ON or OFF the high side switch. The improper operation can stress the components of the power supply and reduce efficiency. Other applications that can benefit from a low side to high side communication may include motor drives such as half bridge configurations or full bridge configurations.

Therefore, a high side signal interface is needed to reliably interpret an ON and OFF command from a control circuit. In one example in accordance with the teachings of the present disclosure, a high side signal interface accounts for the variation in the parasitic capacitance, inductance, and resistance that connects the control circuit to the high side signal interface circuit. The high side signal interface circuit rejects those signals in all the conditions mentioned above.

To illustrate, FIG. 1 shows a functional block diagram of an example power converter 100 including an input voltage $V_{IN}$ 102, a first capacitor C1 104, a first inductor L1 106, an energy transfer element T1 108, high side capacitor $C_{BH}$ 112, a low side capacitor $C_{BL}$ 114, a third rectifier 116, an input return 124, a first rectifier D1 126, a second rectifier D2 128, an output return 130, an output capacitor $C_O$ 132, a load 136, a sense circuit 142, and a controller 146. The controller 146 further includes a high side switch 141, a low side switch 143, a control circuit 148 and a high side signal interface circuit 150.

Energy transfer element T1 108 further includes a magnetizing inductance $L_M$ 110, an input winding 118, a first output winding 120, and a second output winding 122. In some examples, the capacitance of first capacitor C1 104 and the inductance of inductor L1 106 are embedded properties of the energy transfer element T1 108 such that the capacitor C1 104 and inductor L1 106 are not discrete physical components.

The example switched mode power converter 100 illustrated in FIG. 1 is coupled in a half bridge LLC configuration, which is just one example of a switched mode power converter that may benefit from the teachings of the present invention. It is appreciated that other known topologies and configurations of switched mode power converters may also benefit from the teachings of the present inventions such as applications related to motor drives.

The power converter 100 provides output power to the load 136 from an input voltage $V_{IN}$ 102. In one example, the input voltage $V_{IN}$ 102 is a rectified input voltage from an ac voltage source. The high side switch 141 is coupled to receive the input voltage $V_{IN}$ 102 from a first end of the high side switch 141. The second end of high side switch 141 is coupled to a first end of the low side switch 143 by half bridge node 103. The second end of low side switch 143 is further coupled to the input return 124. The first capacitor C1 104 is coupled to a first inductor L1 106 and may function together as a tank circuit 107 coupled to the high side switch 141 and low side switch 143 at the half bridge node 103. Energy transfer element T1 108 is coupled to the tank circuit 107 such that energy is transferred from the input winding 118 to the output windings 120 and 122 in response to the switching of the high side switch 141 and low side switch 143. First output winding 120 is coupled to a first rectifier D1 126. In one example, the first rectifier D1 126 is a diode. However, in some examples, the first rectifier D1 126 may be a transistor used as a synchronous rectifier. Energy is transferred and rectified by first rectifier D1 126 when the high side switch 141 is turned ON and the low side switch 143 is OFF.

The second output winding 122 is coupled to second rectifier D2 128. In one example, the second rectifier D2 128 is a diode. However, in some examples, the second rectifier D2 128 may be a transistor used as a synchronous rectifier. Energy is transferred and rectified by rectifier D2 128 when the high side switch 141 is turned OFF and the low side switch 143 is ON. The output capacitor $C_O$ 132 and load 136 are coupled to the first rectifier D1 126 and second rectifier D2 128. An output is provided to the load 136 and may be provided as either an output voltage $V_O$ 138, and output current $I_O$ 134, or a combination of the two. For a resonant converter, the output voltage is controlled by adjusting the switching frequency and not the duty cycle. The duty cycle of a LLC half bridge is ideally fifty percent for the low side switch and high side switch.

The power converter 100 further includes circuitry to regulate the output, which is exemplified as output quantity $U_O$ 140. In general, the output quantity $U_O$ 140 is either an output voltage $V_O$ 138, an output current $I_O$ 134, or a combination of the two. A sense circuit 142 is coupled to sense the output quantity $U_O$ 140 and to provide a feedback signal $U_{FB}$ 144, which is representative of the output quantity $U_O$ 128. Feedback signal $U_{FB}$ 144 may be a voltage signal or a current signal.

In one example, there may be a galvanic isolation (not shown) between the controller 146 and the sense circuit 142. The galvanic isolation could be implemented by using devices such as an opto-coupler, a capacitor or a magnetic coupling. In a further example, the sense circuit 142 may utilize a voltage divider to sense the output quantity $U_O$ 140 from the output of the power converter 100.

Controller 146 is coupled to the sense circuit 142 and receives the feedback signal $U_{FB}$ 144 from the sense circuit 142. Control circuit 148 is operable to provide a low side drive signal $U_{D2}$ 158 to the low side switch 143. The control circuit outputs an ON signal $U_{ON}$ 160 and OFF signal 162 to the high side signal interface circuit 150. The high side signal interface circuit 150 controls the high side switch 141 in response to the ON signal $U_{ON}$ 160 and OFF signal $U_{OFF}$ 162.

In operation, the high side signal interface circuit 150 receives an ON signal $U_{ON}$ 160, or an OFF signal $U_{OFF}$ 162 to determine the operation of the high side switch 141. In an initial state, the ON signal $U_{ON}$ 160 and OFF signal $U_{OFF}$ 162 are pulled up to the bypass voltage $V_{BH}$ 152. In order for the high side switch 141 to turn ON, the control circuit 160 pulls the ON signal 160 $U_{ON}$ low, which sinks current out of the high side interface circuit 150. To switch the high side switch 141 OFF, the control circuit 160 pulls the OFF signal $U_O$ 162 low, which sinks current out of the high side interface circuit 150.

For instance, a first operation where the voltage at the half bridge node is not slewing and therefore no common mode signaling. In one example, the low side switch 143 is ON and the high side switch 141 is OFF, and the voltage at the half bridge node 103 is ground referenced. To turn ON the high side switch 141, the control circuit 148 pulls the ON signal 160 low. Since the voltage at the half bridge node 103 is at a ground potential when the low side switch 143 is ON, there are substantially no common mode signals that would affect the ON signal $U_{ON}$ 160 and the high side signal interface circuit 150 generates a drive signal $U_{D1}$ 156 in response to the ON signal $U_{ON}$ 160.

In a second operation, the voltage half bridge node 103 is slewing which creates a common mode signal due to a fixed parasitic capacitance to ground. A high signal interface circuit 150 can discern the ON signal $U_{ON}$ 160 or OFF signal $U_{OFF}$ 162 in the presence of a common mode signal. The common mode signal can be positive or negative with respect to the bypass voltage $V_{BH}$ 152. In one example, the low switch 143 has just turned OFF allowing the voltage at the half bridge node 103 to slew up and controller 148 is signaling the ON signal $U_{ON}$ 160 to turn on the high side switch 141. A fixed parasitic capacitance to the ground will cause both the ON and OFF signal to be pulled down with respect to $V_{BH}$ 152. The common mode voltage varies with the slew rate event. The greater the parasitic capacitance, the greater drop in voltages associated with the ON signal 160 and the OFF signal 162. However, the ON signal $U_{ON}$ 160 and OFF signal $U_{OFF}$ 162 does not change in magnitude with the slew rate. Further details of the high signal interface circuit 150 will be described in FIG. 2.

Figure 2:
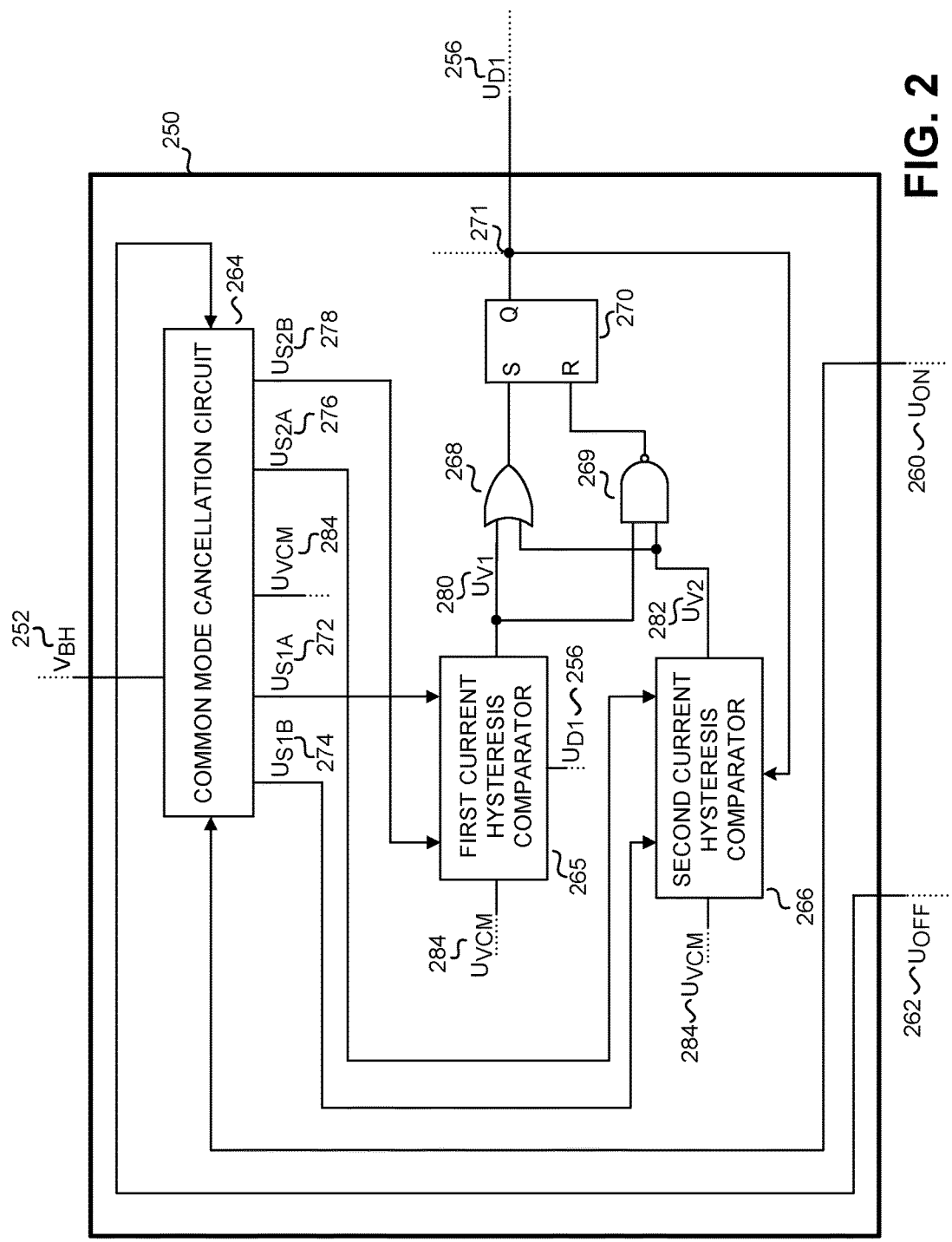
FIG. 2 is a block diagram schematic of an example high side signal interface circuit, in accordance with the teachings of the present disclosure.

FIG. 2 illustrates an example of a high side signal interface circuit 250 in accordance with the teachings of the present disclosure. It is appreciated that high side signal interface circuit 250 of FIG. 2 may be one example of the high side signal interface circuit 150 of FIG. 1, and that similarly named and numbered elements are therefore coupled and function similarly as described above. The high side signal interface circuit 250 is coupled to generate a drive signal $U_{D1}$ 256 in response to the ON signal $U_{ON}$ 260, and OFF signal $U_{OFF}$ 262. The high side signal interface circuit 250 includes a common mode cancellation circuit 264, a first current hysteresis comparator 265, a second current hysteresis comparator 266, logic gates 268 and 269, and a latch 270.

The common mode cancellation circuit 264 is coupled to receive the ON signal $U_{ON}$ 260 and OFF $U_{OFF}$ signal 262 and output a first current signal $U_{S1A}$ 272, a second current signal $U_{S1B}$ 274, a third current signal $U_{S1A}$ 276, a fourth current signal $U_{S2B}$ 278, and a common mode rejection signal $U_{VCM}$ 284.

The first current hysteresis comparator 265 is coupled to generate a first output $U_{V1}$ 280 in response to the first current signal $U_{S1A}$ 272, the fourth current signal, the common mode rejection signal $U_{VCM}$ 284, and the drive signal $U_{D1}$ 256. The second current hysteresis comparator 266 is coupled to generate a second output $U_{V2}$ 282 in response to the second current signal $U_{S2B}$ 274, the third current signal $U_{S1A}$ 276, the common mode rejection signal $U_{VCM}$ 284, and the drive signal $U_{D1}$ 256. The drive signal $U_{D1}$ 256 is coupled to select the hysteresis ratio of the first current hysteresis comparator 265 and second current hysteresis comparator 266, as will be further explained in FIG. 4B.

Logic gate 268 is coupled to receive the first output signal $U_{V1}$ 280 and the second output signal $U_{V2}$ 282. In one example, logic gate 268 is an OR gate. Logic gate 269 is coupled to receive the first output signal $U_{V1}$ 280 and the second output signal $U_{V2}$ 282. In one example, logic gate 269 is a NAND gate. The output of logic gate 268 is coupled to the set terminal of latch 270. The output of logic gate 269 is coupled to the reset terminal of latch 270. The output 271 of latch 270 is coupled to generate drive signal $U_{D1}$ 256.

The common mode cancellation circuit 264 provides signals to the first current hysteresis comparator 265 and second current hysteresis comparator 266 to determine a valid ON signal $U_{ON}$ 260 or OFF signal $U_{OFF}$ 262. The first and second current hysteresis comparators pull current from the first current signal $U_{S1A}$ 272, the second current signal $U_{S1B}$ 274, the third current signal $U_{S1A}$ 276, and the fourth current signal $U_{S2B}$ 278. In one example, the comparator signals can range from 100 nanoamps to 10's of microamps.

In a first operation the voltage at the half bridge node 103 is not slewing and therefore no common mode signaling. Prior to switching, the ON signal $U_{ON}$ 260 and the OFF signal $U_{OFF}$ 262 are pulled up to the bypass voltage $V_{BH}$ 252. To initiate an ON signal to the high side interface 250, the voltage of the ON signal $U_{ON}$ 260 will be smaller relative to the voltage of the OFF $U_{OFF}$ signal 262. The common mode cancellation circuit 264 generates a first current signal $U_{S1A}$ 272 that is lower than the fourth current signal $U_{S2B}$ 278. As a result, the first output $U_{V1}$ 280 of the first current hysteresis comparator 265 transitions to a logic high. The second current signal $U_{S1B}$ 274 is lower than the third current signal $U_{S1A}$ 276. As a result, the second output $U_{V2}$ 282 of the second current hysteresis comparator 266 transitions to a logic high. The common mode rejection signal $U_{VCM}$ 284 is approximately 1 times the voltage threshold ($V_T$) below the bypass voltage $V_{BH}$ 252.

In a second operation, the voltage at the half bridge node slewing creates a common mode signal due to a fixed parasitic capacitance to ground. The high side signal interface circuit 250 can discern the ON signal $U_{ON}$ 160 or OFF signal $U_{OFF}$ 162 in the presence of the common voltage. The common mode signal can be positive or negative with respect to the bypass voltage $V_{BH}$ 152. In one example, the low switch side has just turned OFF allowing the voltage at the half bridge node to slew up and the high side signal interface 250 receives a signaling to ON turn on the high side switch from the controller in FIG. 1. Depending on the slew rate and parasitic capacitance, the common mode rejection signal $U_{VCM}$ 284 can be much lower in comparison to the common mode rejection signal $U_{VCM}$ 284 of the first case mentioned previously. The common mode signal can be much larger than the ON signal $U_{ON}$ 260 or OFF signal $U_{OFF}$ 262. In one example, if the bypass voltage is 9 volts, the subsequent common mode rejection voltage is 7.5 volts. To initiate an ON signal to the high side interface 250, the ON signal $U_{ON}$ 260 is by pulled low and is of lower value relative to the OFF signal $U_{OFF}$ 262. The common mode voltage generated by the half bridge slew is rejected, and first current hysteresis comparator 265 and second current hysteresis comparator 266 are triggered.

In another example of the second operation, the voltage at the half bridge node is slewing down while an ON signal $U_{ON}$ 260 or an OFF signal $U_{OFF}$ 262 is sent to the high side signal interface circuit 250. The high side receiver can discern the ON signal $U_{ON}$ 260 and OFF signal $U_{OFF}$ 262 when the parasitic capacitance of the ON signal $U_{ON}$ 260 and OFF signal $U_{OFF}$ 262 creates a common mode voltage that is greater than the bypass voltage $V_{BH}$ 252. The ON signal $U_{ON}$ 260 or OFF signal $U_{OFF}$ 262 are pulling down with respect to the bypass voltage $V_{BH}$ 252, partially counteracts the common mode voltage which is pulling up both of the inputs to the high side signal interface circuit 250.

Figure 3:
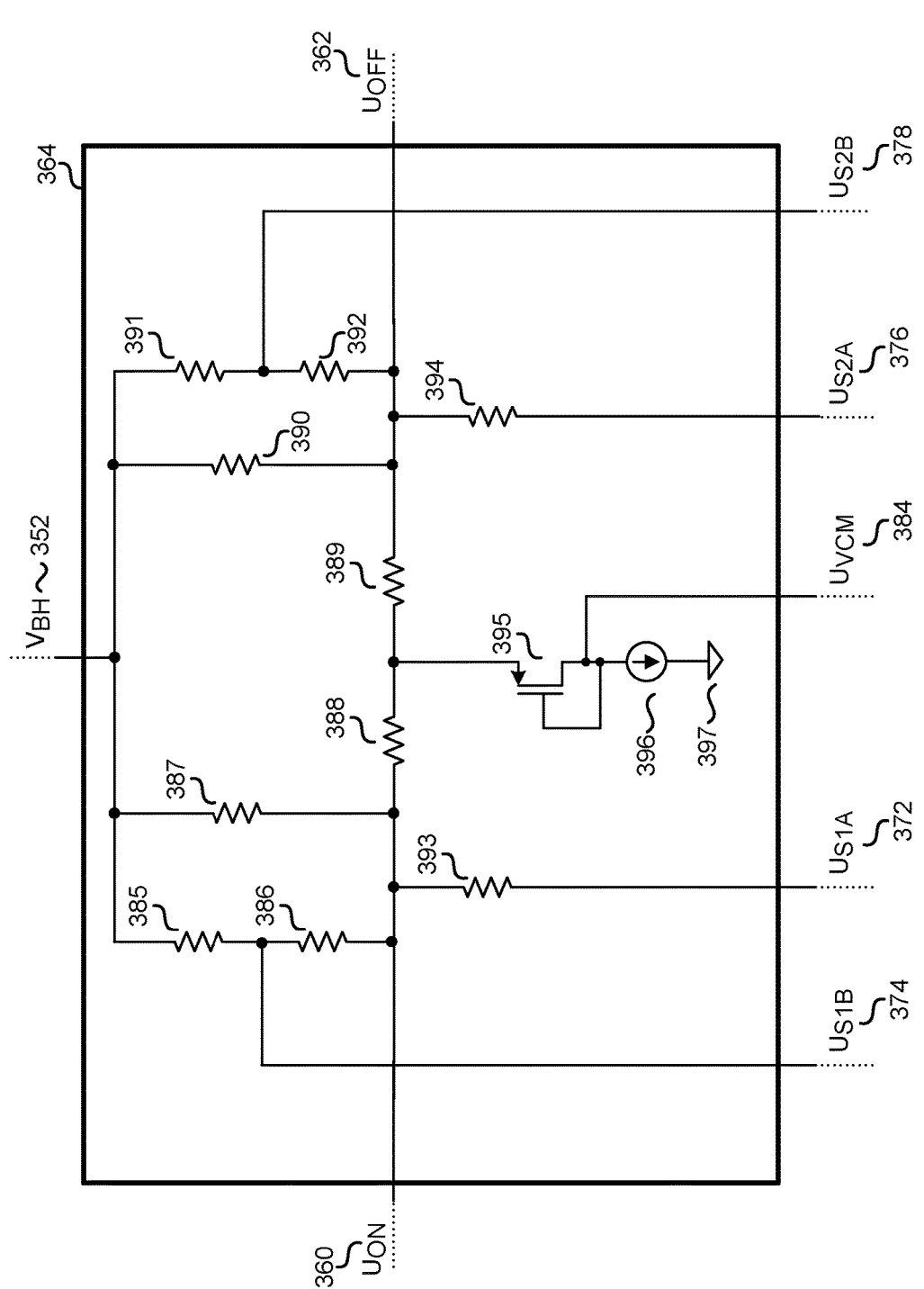
FIG. 3 is a block diagram schematic of an example illustrating one example of a common mode cancellation circuit, in accordance with the teachings of the present disclosure.

FIG. 3 illustrates an example common mode cancellation circuit 364, in accordance with the teachings of the present disclosure. It is appreciated that common mode cancellation circuit 364 of FIG. 3 may be one example of the common mode cancellation circuit 264 of FIG. 2, and that similarly named and numbered elements are therefore coupled and function similarly as described above. The common mode cancellation circuit 364 is coupled to receive the ON signal $U_{ON}$ 360 and the OFF signal $U_{OFF}$ 362 and outputs a first current signal $U_{S1A}$ 372, a second current signal $U_{S1B}$ 374, a third current signal $U_{S1A}$ 376, a fourth current signal $U_{S2B}$ 378 and a common mode rejection signal $U_{VCM}$ 384 in response to the ON signal 360 and OFF signal 362. Common mode cancellation circuit 364 includes resistors 385, 386, 387, 388, 389, 390, 391 393, 394, transistor 395, current source 396 and a local return 397. The high side bypass voltage $V_{BH}$ 352 provides a supply rail to the common mode cancellation circuit 364. Resistors 387 and 390 act as pull up resistors that are pulled up to the voltage of the high side bypass voltage $V_{BH}$ 352. The value of resistors 387 and 390 are selected such that output values of common mode cancellation circuit 364 can be detected by the first and second current hysteresis comparators 265 and 266, but not so large that common mode slew rates will not oversaturate the ON signal 360 and OFF signal 362.

The first current signal $U_{S1A}$ 372 is generated at one end of a first resistor divider including resistors 386 and 393. The second current signal $U_{S1B}$ 374 is generated by a second resistor divider including resistors 385 and 386. As shown, one end of the second resistor divider is coupled to receive the bypass voltage $V_{BH}$ 352, the other end of the second resistor divider is coupled to receive the ON signal, and an intermediate terminal of the second resistor divider is generate the second current signal $U_{S1A}$ 376. In addition, resistor 386 is shared among the first and second resistor dividers such that one end of the first resistor divider is the intermediate terminal of the second resistor divider and is coupled to be pulled up through first pull up resistor 387, the other end of the first resistor divider is coupled to generate the first current signal $U_{S1A}$ 372, and an intermediate terminal of the first resistor divider is coupled to receive the ON signal.

The third current signal $U_{S1A}$ 376 is generated by a third resistor divider including resistors 390 and 394. As shown in the example, the third resistor divider includes the second pull up resistor 390 such that one end of the third resistor divider is coupled to receive the bypass voltage, the other end of the third resistor divider is coupled to generate the third current signal $U_{S1A}$ 376, and an intermediate terminal of the third resistor divider is coupled to receive the OFF signal. The fourth current signal $U_{S2B}$ 378 is generated by a fourth resistor divider of resistors 391 and 392. One end of the fourth resistor divider is coupled to receive the bypass voltage $V_{BH}$ 352, the other end of the fourth resistor divider is coupled to receive the OFF signal, and an intermediate terminal of the fourth resistor divider is coupled to generate the fourth current signal $U_{S2B}$ 378.

A fifth resistor divider including resistors 388 and 389 has one end coupled to receive the ON signal, the other end of the fifth resistor divider is coupled to receive the OFF signal, and an intermediate terminal of the fifth resistor divider is coupled to current source 396 through transistor 395 such that current source 396 pulls current through transistor 395 from the intermediate terminal of the fifth resistor divider. The gate voltage of transistor 395, which is coupled to the drain of transistor 395, provides a common mode rejection signal $U_{VCM}$ 384 to the first and second current hysteresis comparators 265 and 266 to provide the cancellation or rejection of common mode signals caused by half bridge slew in accordance with the teachings of the present invention.

Figure 4:
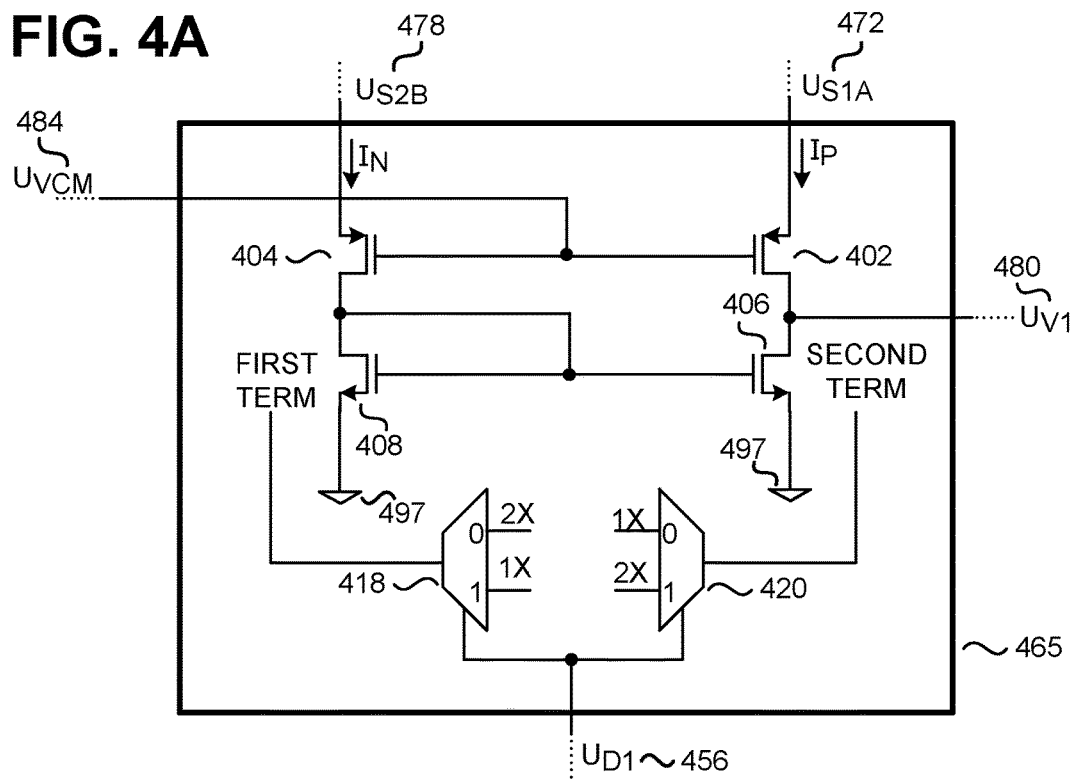
FIG. 4A is a block diagram schematic of an example first current hysteresis comparator, in accordance with the teachings of the present disclosure.
FIG. 4B is a block diagram schematic of an example second current hysteresis comparator, in accordance with the teachings of the present disclosure.

FIG. 4A illustrates a block diagram of an example first current hysteresis comparator 465. It is appreciated that first current hysteresis comparator 465 of FIG. 4A may be one example of the first current hysteresis comparator 265 of FIG. 2, and that similarly named and numbered elements are therefore coupled and function similarly as described above. The first current hysteresis comparator 465 is coupled to receive the first current signal $U_{S1A}$ 472, the fourth current $U_{S2B}$ 478, the common mode rejection signal $U_{VCM}$ 484, and the high side drive signal $U_{D1}$ 456, to generate a first output signal $U_{V1}$ 480. The first current hysteresis comparator 465 includes transistors 402, 404, 406, 408, and multiplexers 418 and 420. As shown, transistors 406 and 408 are coupled to form a current mirror. A source terminal of transistor 404 is coupled to receive the fourth current $U_{S2B}$ 478 and a drain terminal of the transistor 404 is coupled to a drain terminal of transistor 408. A source terminal of transistor 402 is coupled to receive the first current signal $U_{S1A}$ 472 and a drain terminal of the transistor 402 is coupled to a drain terminal of transistor 406. The gate terminals of transistors 402 and 404 are coupled to receive the common mode rejection signal $U_{VCM}$ 484. A first term of transistor 408 is selected in response to multiplexer 418 in response to the high side drive signal $U_{D1}$ 456. A second term of transistor 406 is adjusted in response to multiplexer 420 in response to the high side drive signal $U_{D1}$ 456. As will be discussed, the first term and second term form to describe a current mirror ratio of transistor 408 to transistor 406.

The first current hysteresis comparator 465 can identify a true ON signal, OFF signal, or if current is flowing due to common mode by drawing current from the fourth current signal $U_{S2B}$ 478 and first current signal $U_{S1A}$ 472. The multiplexer 418 selects the first term of a current mirror ratio in response to the high side drive signal $U_{D1}$ 456. The multiplexer 420 selects the second term of the current mirror ratio in response to the high side drive signal $U_{D1}$ 456. In one example, the first and second term selected forms the current mirror ratio of transistor 408 relative to transistor 406. In one example, the current mirror ratio is a 2:1 ratio, and transistor 408 has a current than is twice as great as transistor 406. In another example, the current mirror ratio is 1:2 ratio, and transistor 406 has a current that is twice as great as transistor 408. For the current hysteresis comparator 465, transistor 404 operates as the inverting terminal, and transistor 402 operates as the non-inverting terminal.

When the voltage at the half bridge node is not slewing, the common mode voltage of the ON signal and OFF signal is less than the high side bypass voltage. If the high side switch is OFF, the high side drive signal $U_{D1}$ 456 will equal to zero. The multiplexers select a first term of current mirror ratio of 2, and a second term of current mirror ratio of 1. Therefore, the current mirror ratio is 2:1. The first output signal $U_{V1}$ 480 is a logic high when the fourth current signal $U_{S2B}$ 478 is greater than the current of the first current signal $U_{S1A}$ 472 divided by two. In the case that the ON signal is pulled down, the common mode rejection signal $U_{VCM}$ 484 falls, and the first current signal $U_{S1A}$ 472 and the third current signal $U_{S2B}$ 478 falls below the common mode voltage. As such, the first current signal $U_{S1A}$ 472 is reduced. If the ON signal is further reduced such that the first current signal $U_{S1A}$ 472 is less than the current of $I_N$ divided by two, the first output signal $U_{V1}$ 480 will be a logic low.

FIG. 4B illustrates a block diagram of an example second current hysteresis comparator 466. It is appreciated that second current hysteresis comparator 466 of FIG. 4B may be one example of the second current hysteresis comparator 266 of FIG. 2, and that similarly named and numbered elements are therefore coupled and function similarly as described above. The second comparator 466 is coupled to receive the second current $U_{S1B}$ 474, the third current signal $U_{S1A}$ 476, the common mode rejection signal $U_{VCM}$ 484, and the high side drive signal $U_{D1}$ 456, to generate a second output signal $U_{V1}$ 482. The second current hysteresis comparator 466 includes transistors 410, 412, 414, 416, and multiplexers 422 and 424. As shown, transistors 414 and 416 are coupled to form a current mirror. A source terminal of transistor 412 is coupled to receive the third current $U_{S1A}$ 476 and a drain terminal of the transistor 412 is coupled to a drain terminal of transistor 416. A source terminal of transistor 410 is coupled to receive the second current signal $U_{S1B}$ 474 and a drain terminal of the transistor 410 is coupled to a drain terminal of transistor 414. The gate terminals of transistors 410 and 412 are coupled to receive the common mode rejection signal $U_{VCM}$ 484. A third term of transistor 416 is selected in response to multiplexer 422 in response to the high side drive signal $U_{D1}$ 456. A fourth term of transistor 414 is selected in response to multiplexer 424 in response to the high side drive signal $U_{D1}$ 456. The third term and fourth term form to describe a current mirror ratio of transistor 416 to transistor 414.

The second current hysteresis comparator 466 can identify a true ON signal, OFF signal, or if the current is flowing due to common mode by drawing current from the second current signal $U_{S1B}$ 474 and the third current signal $U_{S1A}$ 476. The multiplexer 422 selects the third term of the current mirror ratio in response to the high side drive signal $U_{D1}$ 456. The multiplexer 424 selects a fourth term of transistor 414 in response to the high side drive signal $U_{D1}$ 456. In one example, the third and fourth term selected describes the current mirror ratio of transistor 416 relative to transistor 414. In one example, a current mirror ratio of a 2:1 ratio describes transistor 416 having a current that is twice as great as transistor 414. In another example, a current mirror ratio of 1:2 ratio describes transistor 414 having a current that is twice as great as transistor 416. For the second current hysteresis comparator 466, transistor 412 operates as the inverting terminal, and transistor 410 operates as the non-inverting terminal.

When the voltage at the half bridge node is not slewing, the common mode voltage of the ON signal and OFF signal is less than the high side bypass voltage. If the high side switch is OFF, the first high side drive signal $U_{D1}$ 456 will equal to zero. The multiplexer 422 selects the third term ratio of 2 for the transistor 416, and a fourth term ratio of 1 for the transistor 414. The second output signal $U_{V2}$ 482 is a logic high when the third current signal $U_{S1A}$ 476 is greater than the current of second current signal $U_{S1B}$ 474 divided by two. In the case that the ON signal is pulled down, the common mode rejection signal $U_{VCM}$ 484 falls, and the third current signal $U_{S1A}$ 476, second current signal $U_{S1B}$ 474 falls below the common mode voltage. As such, the third current signal $U_{S1A}$ 476 is reduced. If the ON signal is further reduced such that the third current signal $U_{S1A}$ 476 is less than the current of the second current signal $U_{S1B}$ 474 divided by two, the second output signal $U_{V2}$ 482 will be a logic low.

Figure 5:
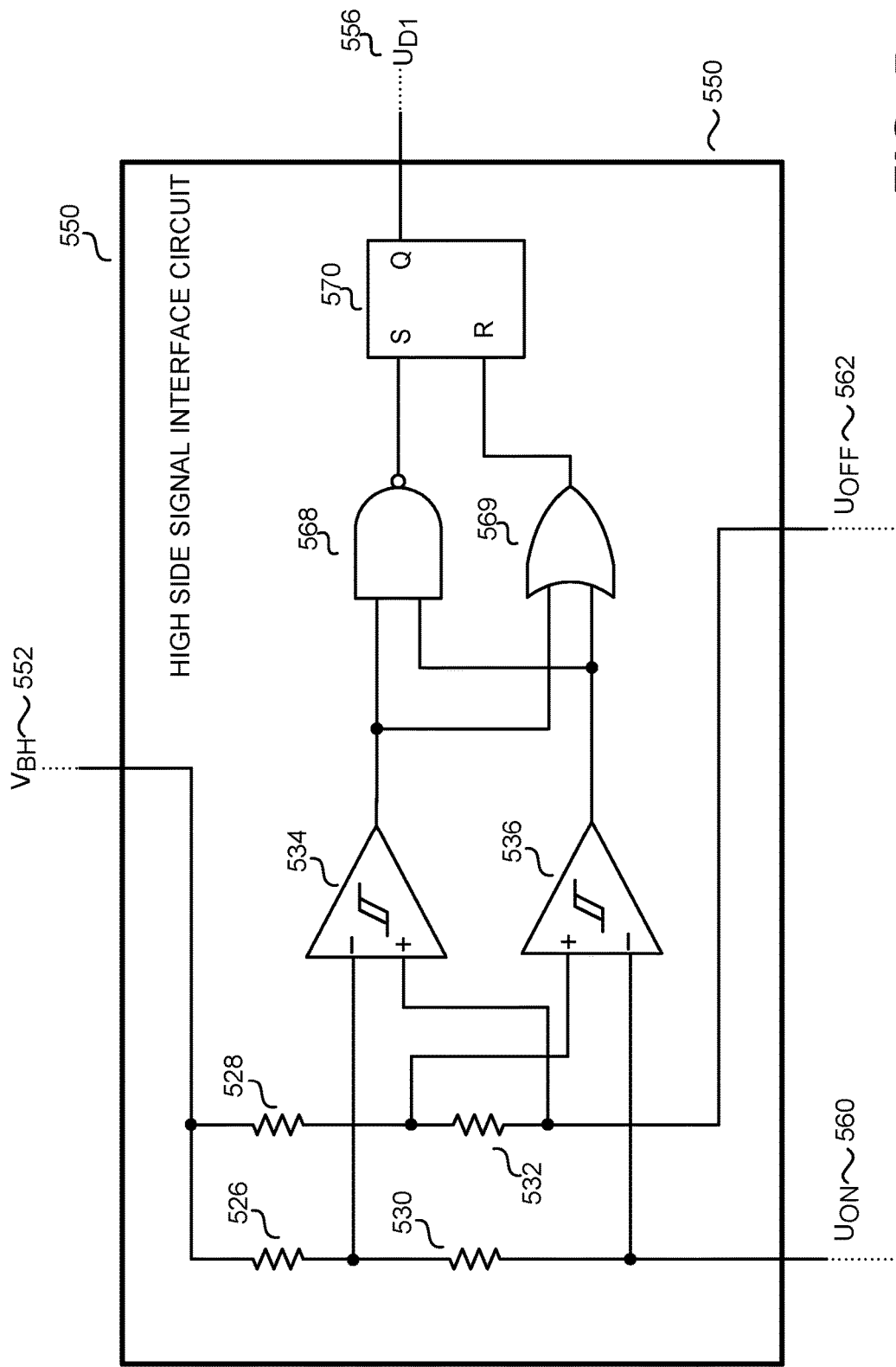
FIG. 5 is a block diagram schematic of another example of a high side signal interface circuit, in accordance with the teachings of the present disclosure.

FIG. 5 shows another example block diagram schematic of a high side signal interface circuit 550, in accordance with the teachings of the present disclosure. It is appreciated that high side signal interface circuit 550 of FIG. 5 may be another example of the high side signal interface circuit 150 of FIG. 1, and that similarly named and numbered elements are therefore coupled and function similarly as described above. In contrast to the example high side signal interface circuit 250 depicted in FIG. 2, the example high side signal interface circuit 550 depicted in FIG. 5 uses a voltage comparison of the ON signal 560 and OFF signal 562 instead of a current comparison as depicted in the example high side signal interface circuit 250 depicted FIG. 2. The high side signal interface circuit 550 includes resistors 526, 528, 530, 532, Schmitt triggers 534, 536, logic gates 568, 569, and latch 570. The high side signal interface 556 is coupled to receive the ON signal $U_{ON}$ 560 and the OFF signal $U_{OFF}$ 562, and output a drive signal $U_{D1}$ 556.

As shown, resistors 526 and 530 form a resistor divider having one end coupled to receive the bypass voltage $V_{BH}$ 552 and an other end coupled to receive the ON signal $U_{ON}$ 560. An intermediate terminal of the resistor divider formed with resistors 526 and 530 is coupled to an inverting terminal of Schmitt trigger 534. The non-inverting terminal of Schmitt trigger 534 is coupled to receive the OFF signal $U_{OFF}$ 562. Resistors 528 and 538 form a resistor divider having one end coupled to receive the bypass voltage $V_{BH}$ 552 and an other end coupled to receive the OFF signal $U_{OFF}$ 562. An intermediate terminal of the resistor divider formed with resistors 528 and 532 is coupled to a non-inverting terminal of Schmitt trigger 536. The inverting terminal of Schmitt trigger 536 is coupled to receive the ON signal $U_{ON}$ 560.

The resistors 526 and 528 are coupled to receive a bypass voltage $V_{BH}$ 552 and form a hysteresis threshold. The hysteresis threshold creates an offset that is proportional to the common mode current that is generated by slewing at the half bridge node. The high side signal interface circuit 550 accepts very large positive and negative common mode inputs, and still discerns a differential ON or OFF signal.

The output of Schmitt trigger 534 is coupled to one input of logic gate 568, and one input of logic gate 569. In one example, logic gate 568 is a NAND gate and logic gate 569 is an OR gate. The output of Schmitt trigger 536 is coupled to another input of logic gate 568 and another input of logic gate 569. The output of logic gate 568 is coupled to the set terminal of latch 570. The output of logic gate 569 is coupled to the reset terminal of latch 570. The output of latch 570 is coupled to generate drive signal $U_{D1}$ 556.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A controller for use in a power converter of a motor drive, the controller comprising:
   a control circuit configured to turn ON a high side switch by sinking a current of an ON signal; and
   a high side signal interface circuit coupled to receive the ON signal to generate a drive signal to control switching of the high side switch coupled to a half bridge node of the power converter in a presence of a common mode signal caused by slewing at the half bridge node, wherein the high side signal interface circuit comprises:
      a common mode cancellation circuit coupled to provide a common mode rejection signal to provide a cancellation or rejection of the common mode signal, wherein the common mode cancellation circuit generates a first current signal and a fourth current signal; and
      a first current hysteresis comparator coupled to receive the common mode rejection signal, the first current signal, and the fourth current signal, and generate a first output signal in a presence of a common mode voltage.

2. The controller of claim 1, wherein the control circuit is further configured to turn OFF the high side switch by sinking a current of an OFF signal coupled to the high side interface circuit.

3. The controller of claim 1, wherein the high side signal interface circuit comprises a second current hysteresis comparator coupled to receive the common mode rejection signal, a second current signal, and a third current signal, and generate a second output signal in the presence of the common mode voltage.

4. The controller of claim 1, wherein the first output signal is coupled to a logic gate, wherein an output of the logic gate is coupled to a set terminal of a latch which generates a drive signal for the high side switch.

5. The controller of claim 3, wherein the second output is coupled to a logic gate, wherein an output of the logic gate is coupled to a reset terminal of a latch which generates a drive signal for the high side switch.

6. The controller of claim 4, wherein the first current hysteresis comparator comprises:
   a first transistor coupled to receive the first current signal;
   a second transistor coupled to receive the fourth current signal, wherein the first transistor and second transistor are coupled to form a current mirror, wherein the current mirror is coupled to generate the first output signal in response to the first current signal and fourth current signal; and
   a multiplexer coupled to receive the drive signal in order to select a term of a current mirror ratio of the current mirror.

7. The controller of claim 3, wherein the second current hysteresis comparator comprises:
   a third transistor coupled to receive the second current signal;
   a fourth transistor coupled to receive the third current signal, wherein the third transistor and fourth transistor are coupled to form a current mirror, wherein the current mirror is coupled to generate the second output signal in response to the second current signal and fourth current signal; and
   a multiplexer coupled to receive the drive signal in order to select a term of a current mirror ratio of the current mirror.

8. The controller of claim 6, wherein a gate terminal of the current mirror is coupled to receive the common mode rejection signal.

9. A resonant power converter, comprising:
   a high side switch coupled to receive an input voltage at one end of the high side switch;
   a low side switch coupled to an input return at one end of the low side switch, wherein an other end of the low side switch is coupled to an other end of the high side switch at a half bridge node, wherein a voltage of the half bridge node resonates between a ground reference and the input voltage;
   a tank circuit coupled to the high side switch and the low side switch at the half bridge node;
   an energy transfer element coupled to the tank circuit to transfer energy from an input of the resonant power converter to an output of the resonant power converter in response to switching of the high side switch and the low side switch; and
   a controller coupled to control switching of the high side switch and the low side switch in response to a feedback signal representative of the output of the resonant power converter, wherein the controller includes:
      a control circuit configured to turn ON the high side switch by sinking a current of the ON signal; and
      a high side signal interface circuit coupled to receive the ON signal to generate a drive signal to control switching of a high side switch coupled to a half bridge node of the power converter in the presence of a common mode signal caused by slewing at the half bridge node, wherein the high side signal interface circuit comprises:
         a common mode cancellation circuit coupled to provide a common mode rejection signal to provide a cancellation or rejection of the common mode signal, wherein the common mode cancellation circuit generates a first current signal and a fourth current signal; and
         a first current hysteresis comparator coupled to receive the common mode rejection signal, the first current signal, and the fourth current signal, and generate a first output signal in the presence of a common mode voltage.

10. The resonant power converter of claim 9, wherein the high side signal interface circuit comprises a second current hysteresis comparator coupled to receive the common mode rejection signal, a second current signal, and a third current signal, and generate a second output signal in the presence of the common mode voltage.

11. The resonant power converter of claim 10, wherein the high side signal interface circuit further comprises:
   a first logic gate coupled to set the latch in response to the first and second output signals; and
   a second logic gate coupled to reset the latch in response to the first and second output signals.

12. The resonant power converter of claim 11, wherein the first logic gate comprises an OR gate, and wherein the second logic gate comprises a NAND gate.

13. The resonant power converter of claim 9, wherein the common mode cancellation circuit comprises:
   a first pull up resistor coupled to pull up the ON signal to a bypass voltage during an initial state;
   a second pull up resistor coupled to pull up the OFF signal the bypass voltage during the initial state;

a first resistor divider coupled to generate the first current signal at one end of the first resistor divider, wherein an intermediate terminal of the first resistor divider is coupled to the first pull up resistor and is coupled receive the ON signal;

a second resistor divider coupled to generate a second current signal at an intermediate terminal of the second resistor divider, wherein the first and second resistor dividers share a resistor such that one end of the second resistor divider is coupled receive the ON signal, an other end of the second resistor divider is coupled to receive the bypass voltage, and the intermediate terminal of the second resistor divider is an other end of the first resistor divider;

a third resistor divider coupled to generate a third current signal at one end of the third resistor divider, wherein the third resistor divider includes the second pull up resistor such that an intermediate terminal of the third resistor divider is coupled to receive the OFF signal;

a fourth resistor divider coupled to generate the fourth current signal at an intermediate terminal of the fourth resistor divider, wherein one end of the fourth resistor divider is coupled to receive the bypass voltage, and wherein an other end of the fourth resistor divider is coupled to receive the OFF signal;

a fifth resistor divider having one end coupled to receive the ON signal and an other end coupled to receive the OFF signal; and a current source coupled to an intermediate terminal of the fifth resistor divider through a first transistor, wherein the common mode rejection signal is coupled to be generated at a gate terminal coupled to a drain terminal of the first transistor, wherein the common mode rejection signal coupled to provide common mode cancellation to the first current hysteresis comparator and the second current hysteresis comparator.

14. The resonant power converter of claim 9, wherein the high side signal interface circuit comprises:

a sixth resistor divider having one end coupled to receive the bypass voltage, and an other end coupled to receive the ON signal;

a seventh resistor divider having one end coupled to receive the bypass voltage, and an other end coupled to receive the OFF signal;

a first Schmitt trigger having an inverting input coupled to an intermediate terminal of the sixth resistor divider, and a non-inverting input coupled to receive the OFF signal;

a second Schmitt trigger having a non-inverting input coupled to an intermediate terminal of the seventh resistor divider, and an inverting input coupled to receive the ON signal; and a second latch coupled to generate the high side drive signal in response to an output of the first Schmitt trigger and an output of the second Schmitt trigger.

15. The resonant power converter of claim 9 wherein the resonant power converter is a half bridge configuration or full bridge configuration.

* * * * *